United States Patent [19]
Babanezhad

[11] Patent Number: 6,028,479
[45] Date of Patent: Feb. 22, 2000

[54] LOW VOLTAGE TRANSMISSION LINE DRIVER

[75] Inventor: Joseph N. Babanezhad, Cupertino, Calif.

[73] Assignee: Plato Labs, Inc., Campbell, Calif.

[21] Appl. No.: 09/004,628

[22] Filed: Jan. 7, 1998

[51] Int. Cl.[7] .................................................... H03F 3/45
[52] U.S. Cl. ........................................ 330/253; 330/255
[58] Field of Search .................................. 330/253, 255, 330/258, 260

[56] References Cited

U.S. PATENT DOCUMENTS

| | | | |
|---|---|---|---|
| 4,757,275 | 7/1988 | Saller et al. | 330/261 |
| 4,912,425 | 3/1990 | Kobayashi et al. | 330/253 |
| 4,977,378 | 12/1990 | Tero | 330/258 |
| 5,049,653 | 9/1991 | Smith et al. | 330/267 |
| 5,212,455 | 5/1993 | Pernici et al. | 330/253 |
| 5,307,024 | 4/1994 | Metz et al. | 330/260 |
| 5,376,899 | 12/1994 | Pass | 330/253 |
| 5,515,003 | 5/1996 | Kimura | 330/253 |

OTHER PUBLICATIONS

Bales, "A Low–Power, High–Speed, Current–Feedback Op–Amp with a Novel Class AB High Current Output Stage," *IEEE Journal of Solid–State Circuits,* vol. 32, No. 9, Sep. 1997, pp. 1470–1474.

Smith et al., "Evolution of High–Speed Operational Amplifier Architectures," *IEEE Journal of Solid–State Circuits,* vol. 29, No. 10, Oct. 1994, pp. 1166–1179.

*Primary Examiner*—Robert Pascal
*Assistant Examiner*—Khanh Van Nguyen
*Attorney, Agent, or Firm*—Townsend and Townsend and Crew LLP

[57] ABSTRACT

A high-speed low-voltage line-driver circuit implemented using various embodiments of high speed current-feedback opamps is disclosed. The line driver of the present invention uses a fully differential architecture whereby common-mode disturbances, such as noise due to substrate or power supply, are cancelled. The driver also uses a current-feedback approach to achieve larger bandwidth. In a specific embodiment, the current-feedback opamp used in the line driver of the present invention uses class A/B structure for both input and output stages.

19 Claims, 6 Drawing Sheets

LOW VOLTAGE TRANSMISSION LINE DRIVER

BACKGROUND OF THE INVENTION

The present invention relates in general to integrated circuits, and in particular to improved circuit implementations for transmission line drivers particularly suited for networking applications.

In data communication systems, it is often required that a line driver's output impedance and the receiver's input termination resistor match the cable's (i.e., transmission line's) characteristic impedance. Further, in such systems, wide-band transformers are typically utilized to provide the required isolation between the receiver and the transmitter on the one hand and the cable on the other. Two possible approaches exist to implement the line driver. In the first approach, the driver is a voltage source in series with source resistance that has a value equal to the line's characteristic impedance. FIG. 1 is a simplified depiction of this case where a voltage source driver 100 is shown along with source and load resistances $R_S$ and $R_L$, respectively, and isolation transformer 102 with a 1:n turn's ratio. Voltage source driver 100 is implemented by using an operational amplifier (opamp) 104 along with gain-setting resistors R1 and R2 in a closed-loop configuration. One drawback of this approach is the voltage drop across $R_S$ which limits the voltage swing between the driver and the line.

In the second approach, the driver is a current source with a shunt source impedance equal to the cable's characteristic impedance as shown in FIG. 2. The advantage of this solution is that the voltage swing across the current source is the same as that of the load. In the case of 10 BASE-T data communication, for example, this swing is typically 5 volts peak-to-peak (or 5 Vpp). In applications with lower power supply voltages, this provides more margin in order to design the driver. However, in order to design an accurate current source driver, often times opamps are employed in a feedback circuit where a sensing resistor is used in series with the opamp's output in order to determine current source's output current level. Such an implementation eliminates all the extra voltage headroom mentioned above resulting in an almost similar voltage swing limitations as in the case of the voltage source driver shown in FIG. 1.

For higher speed and lower voltage applications, the design of the line driver opamp has posed a few challenges. Prior art approaches have typically utilized voltage-feedback opamps that are particularly suitable in MOS technology since they can easily realize an infinite input impedance due to the MOS transistor's zero gate current level. In high-speed applications, the opamp is often implemented by employing gain-setting resistors. The parallel combination of the gain-setting resistors and the opamp's input capacitance introduces a parasitic pole. The input capacitance is typically a Miller-multiplied version of an MOS transistor's $C_{gd}$ (gate-to-drain capacitance) plus $C_{gs}$ (gate-to-source capacitance). For high speed applications, this parasitic pole can be a serious limiting factor. Another speed limiting factor in CMOS opamps is the limited slew-rate. This is due to the fact that usually the input stage in voltage-feedback opamps, especially in low-voltage applications, is a class-A type circuit where the slowing current is limited to the tail-current of the input differential-pair. Thus, there are at least two drawbacks, namely the existence of a parasitic pole at the opamp's input and the limited slew rate that in combination limit the large-signal bandwidth and speed of operation of the conventional line driver circuits.

There is therefore a need for improved circuitry to implement high speed, low voltage transmission line drivers.

SUMMARY OF THE INVENTION

The present invention provides a high-speed low-voltage line-driver circuitry implemented using various embodiments of high speed current-feedback opamps. Broadly, the line driver of the present invention uses a fully differential architecture whereby common-mode disturbances, such as noise due to substrate or power supply, are cancelled. The driver also uses a current-feedback approach to achieve larger bandwidth. In a specific embodiment, the current-feedback opamp used in the line driver of the present invention uses class A/B structure for both input and output stages. By combining the input stage and a level shift stage into one circuit, the opamp of the present invention eliminates the high impedance parasitic nodes, further eliminating the need for a compensation capacitor. Various other novel techniques have been utilized to increase the slew rate and dynamic range of the opamp while minimizing harmonic distortion and power consumption of the circuit.

Accordingly, in one embodiment, the present invention provides a current-feedback operational amplifier including an input circuit adapted to receive an input current signal; a level shift circuit coupled to the input circuit; a current source circuit coupled to the input circuit and the level shift circuit; and an output circuit coupled to the level shift circuit, wherein, current supplied by the current source circuit is shared by both the input circuit and the level shift circuit. In a more specific embodiment, the amplifier further includes a cascode transistor coupled between the input circuit and the level shift circuit.

In another embodiment, the current-feedback operational amplifier is a fully differential CMOS circuit with class A/B input stage and class A/B output stage. The present invention presents in one embodiment a line driver circuit made up of a current-feedback operational amplifier coupled to gain-setting feedback resistors and output series resistors.

A better understanding of the nature and advantages of the present invention may be gained with reference to the detailed description and the drawings below.

DESCRIPTION OF THE PREFERRED EMBODIMENT

The present invention uses a differential current-feedback opamp instead of a voltage-feedback opamp to implement the line driver circuit. The current-feedback opamp provides a low (ideally zero) input-impedance so that the input parasitic capacitance has very little impact on bandwidth. Further, owing to the common-gate input-stage of the current-feedback opamp, the input operates in a class A/B fashion. By combining the class A/B input stage with a class A/B output stage, full class A/B operation is made possible. Thus, the opamp can achieve slewing currents that is several times higher than its quiescent current, while at the same time it is able to drive heavy external resistive as well as capacitive loads.

Figure 1:
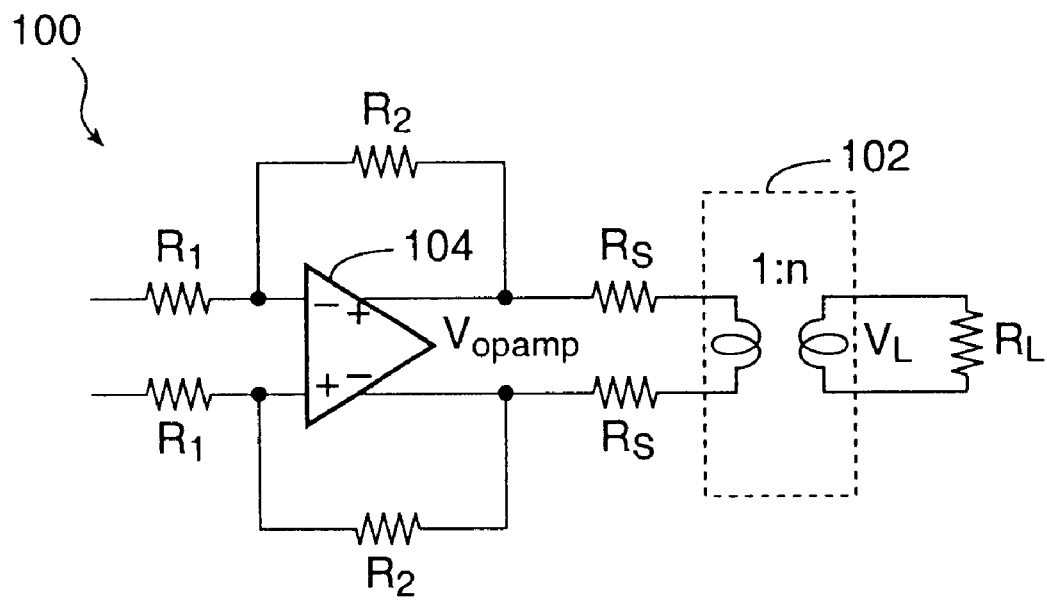
FIG. 1 is a simplified schematic of a voltage source type transmission line driver circuit.
Figure 2:
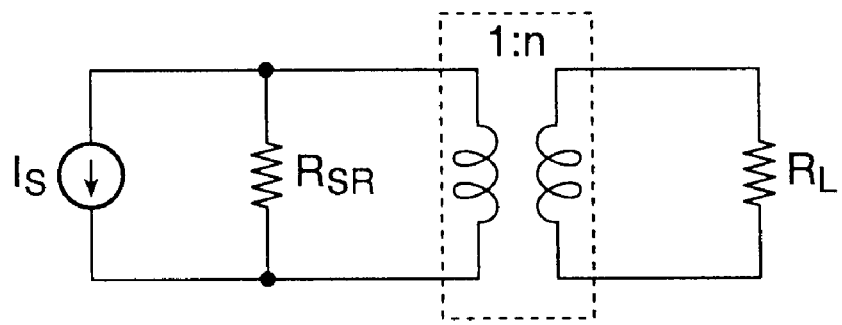
FIG. 2 is a simplified schematic of a current source type transmission line driver circuit.
Figure 3:
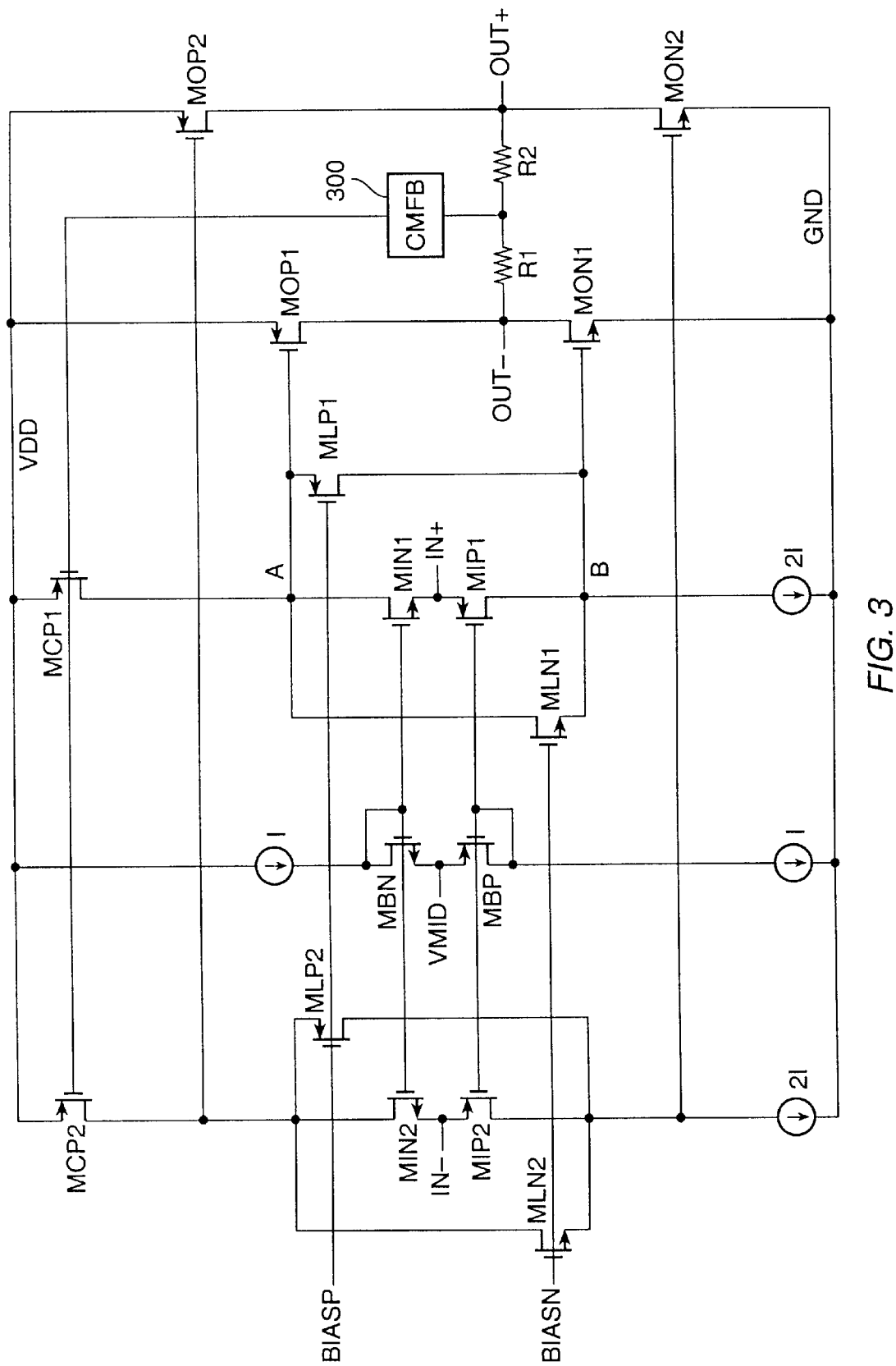
FIG. 3 is a simplified circuit schematic of a current-feedback differential CMOS operational amplifier according to an exemplary embodiment of the present invention.

Referring to FIG. 3, there is shown a simplified version of a differential current-feedback CMOS opamp according to one embodiment of the present invention. Two pairs of common-gate transistors MIN1/MIP1 and MIN2/MIP2 constitute the differential input devices of the opamp. Transistors MBN and MBP realize the bias section providing the biasing for the gate terminals of the input transistors. Combined into the input stage are transistors MLN1/MLP1 and MLN2/MLP2 that provide the level shifting function to generate the right bias level for the differential output stage. The output stage is made up of transistors MOP1/MON1 and MOP2/MON2. Resistors R1 and R2 are the summing resistors for the common-mode feedback (CMFB) circuit 300. Using known circuitry, CMFB circuit 300 amplifies the summing voltage and feeds it to the common-mode feedback p-channel current source transistors MCP1 and MCP2.

In this embodiment, the quiescent current in the input-stage transistors MIP and MIN is set to I, current source transistors MCP1 and MCP2 have a nominal quiescent current level of 2I, and level-shifting devices MLP and MLN have a quiescent current of I/2. The quiescent current in output devices is set by the biasing circuit (not shown) that generates BIASP and BIASN node voltages. The output quiescent current may be, for example, 10I. The current in the input-stage biasing devices MBP and MBN are both equal to I. Therefore, barring any mismatch between these two devices no current is flowing to or from the terminal connected to mid-supply voltage source labeled as VMID. The positive input terminal of this opamp is the common-source terminal of two common-gate transistors MIP1 and MIN1, and the negative input terminal is the common-source terminal of transistors MIN2 and MIP2. The input impedance of the opamp is thus given by $(g_{mip}+g_{min})^{-1}$. This is a relatively low-impedance node which increases the accuracy of the closed-loop performance of the opamp. The impedance of the input terminal can be further reduced by choosing low-value gain-setting feedback resistors, at the cost of increased power consumption in the gain-setting network.

For line-driving applications, the output terminals of the circuit are terminated by a low impedance load of, for example, 50Ω differential. As a result the only high-impedance nodes in the positive half-circuit of the opamp of the present invention are the nodes A and B. Because of the combined input stage/level shift architecture of the opamp, these high impedance nodes are essentially coupled to each other (by means of level-shifting transistors MLP1 and MLN1). This architecture yields a two-stage opamp that has only one high-impedance node, making it very attractive for high speed applications.

As can be noted from the schematic shown in FIG. 3, the opamp of the present invention does not require a frequency compensation capacitor. Various device parasitic capacitances at nodes A and B, in particular $C_{gs}$ and $C_{gd}$ of the large output transistors MOP and MON, provide adequate frequency compensation for this opamp whose other nodes have all low impedances.

As discussed above, having large slewing current capability is another requirement for high-speed opamps. In the opamp of the present invention, when input terminals IN+ and IN− move slightly up or down, the gate-to-source voltage Vgs of input transistors MIP and MIN is modulated. By generating a slewing current that depends on the square of Vgs-Vt, the opamp can generate large currents to directly charge or discharge the parasitic capacitances at nodes A and B. The output-stage transistors MOP and MON provide class A/B type sink and source currents to the output load. The Vgs of these transistors should preferably be increased in order for the output device to be able to provide the necessary output current. However, this cannot be easily achieved in the embodiment shown in FIG. 3 since the gate terminal of transistor MOP (or MON) is not allowed to swing below (or above) the input common-mode voltage, usually equal to VMID. This can be a drawback for networking applications where the output presents a 50Ω differential load.

Figure 4:
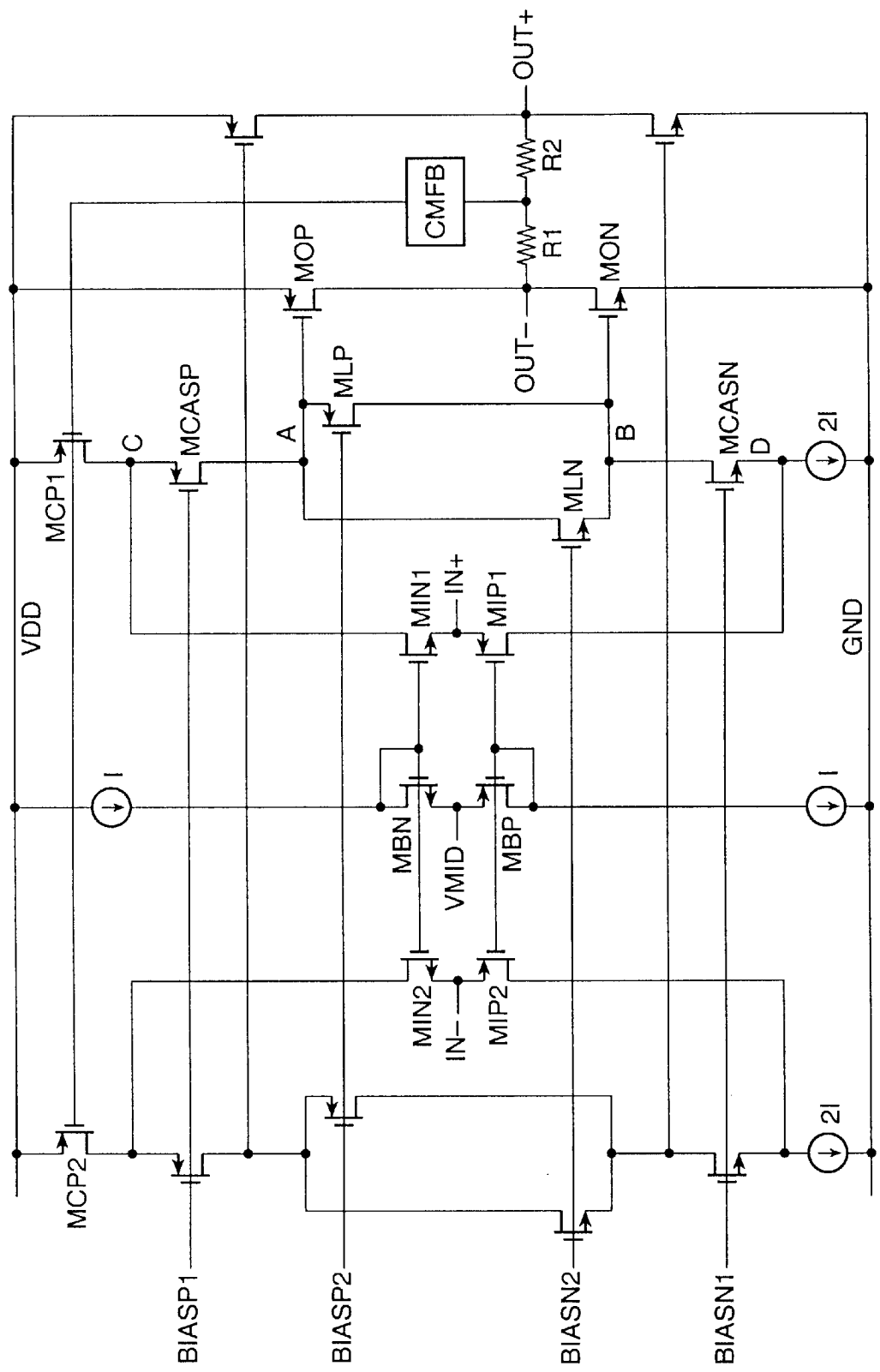
FIG. 4 is a circuit schematic of another embodiment of the current-feedback differential CMOS operational amplifier of the present invention.

FIG. 4 is a circuit schematic of an alternative embodiment of the differential opamp of the present invention. The circuit of FIG. 4 improves on the output source current by inserting cascode transistors MCASP and MCASN between the input common-gate transistors and the level-shifting transistors. The cascode devices allow the gate terminals of transistors MOP and MON to swing below or above the VMID respectively, increasing the output current sink and source capability. The insertion of cascode devices, introduces two additional parasitic nodes C and D.

Figure 5:
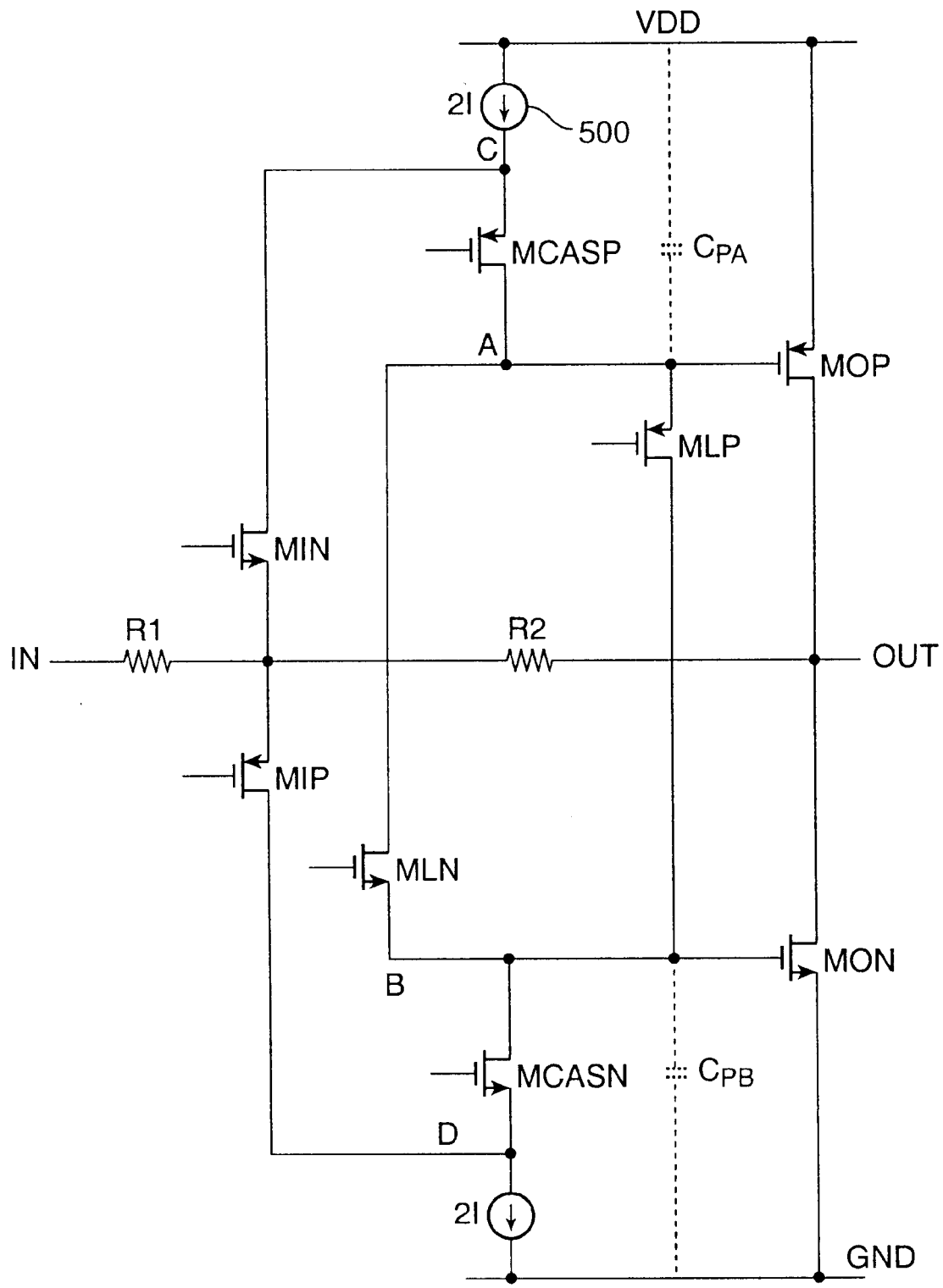
FIG. 5 is a circuit schematic of the half circuit for the current-feedback operational amplifier shown in FIG. 4.

While the circuit of FIG. 4 improves the limited current drive capability of the circuit of FIG. 3, it suffers from zero-crossing distortion. The nature of this drawback is described in greater detail in connection with the circuit of FIG. 5. Referring to FIG. 5, there is shown the opamp's half-circuit along with gain-setting resistors R1 and R2. Also in FIG. 5, the parasitic capacitances of nodes A and B have been represented by CPA and CPB, respectively. The common-mode transistor MCP has been replaced by a constant 2I current source 500. When driving heavy resistive loads and when the differential output voltage crosses the zero axis, e.g., from negative to positive, transistor MOP that was conducting a small stand-by current now has to provide a large sourcing current to thee load. To accomplish this, CPA needs to be charged negatively so that the voltage across it would be equal to the Vgs of MOP. This displacement current needs to flow through level-shifting transistor MLN and n-channel cascode MCASN. However, because of 2I constant current source, input transistor MIP is required to provide this nonlinear displacement current by drastically reducing its current level. This sudden drop in MIP's current level is accompanied by a similar diversion of some current from MIN into the input terminal of opamp.

The input stage of FIG. 4, unlike that of FIG. 3, is no longer a class-AB circuit, since the slewing current is limited to sinking and sourcing 2I current sources. This is in fact one of the main causes for the non-linearity in the operation of the circuit of FIG. 4. Thus, during zero-crossing and while the opamp is slewing there is an imbalance between the current levels of MIN and MIP.

Figure 6:
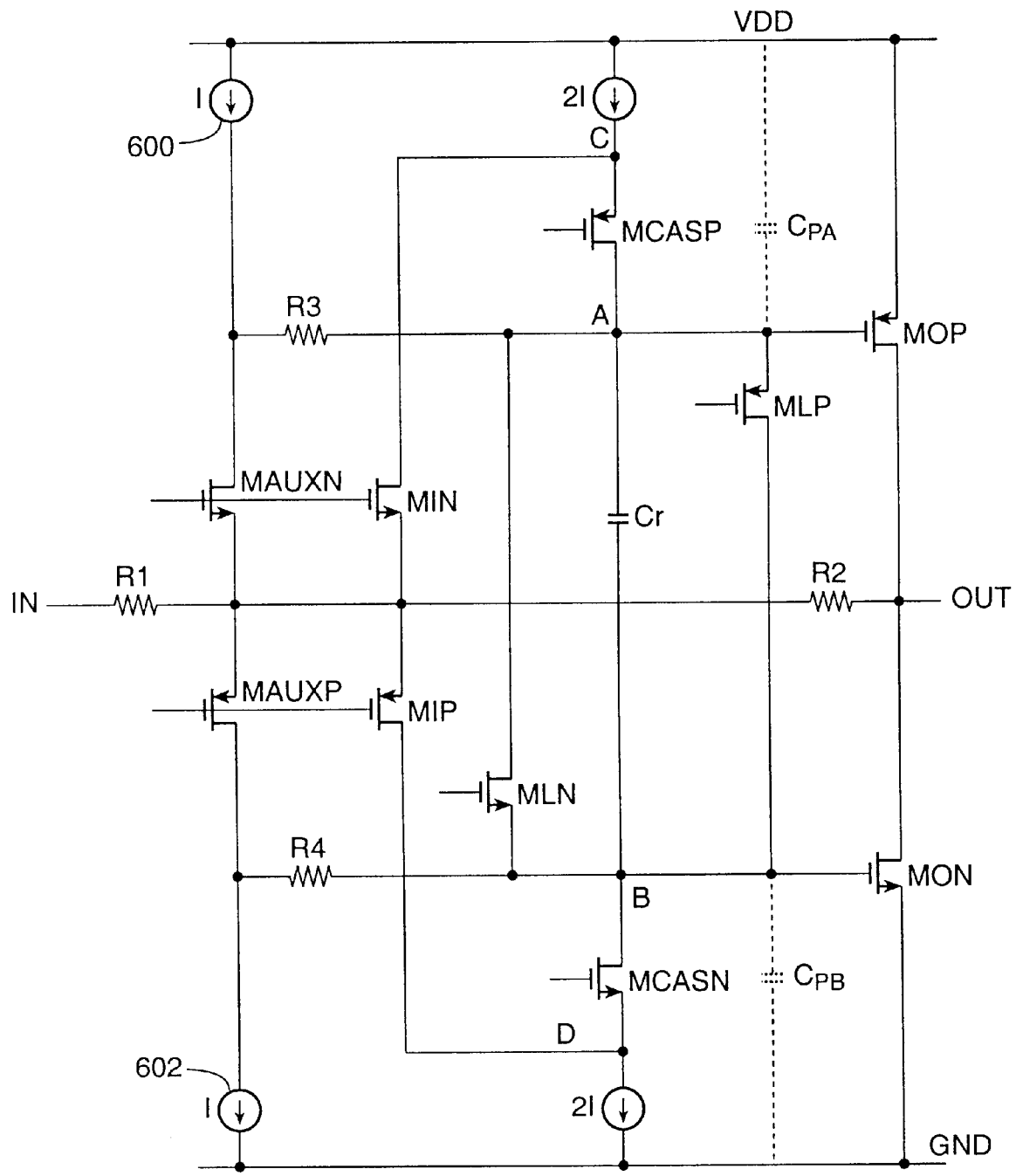
FIG. 6 is shows an improved embodiment for the half-circuit of the current-feedback operational amplifier of the present invention.

In an improved embodiment shown in FIG. 6, the present invention provides an opamp that is substantially free of the above described non-linearity. Referring to FIG. 6, a capacitor Cr connects nodes A and B together and provides a charge reservoir. Capacitor Cr is preferably a relatively large capacitor that may be made of, for example, an MOS device. Instead of flowing through the input terminal of the opamp, large nonlinear displacement currents are partly supplied by this capacitor. Charge-sharing occurs between capacitor Cr and parasitic capacitors CPA and CPB to account for the displacement current. That is, capacitor Cr slows down the switching of the level-shifting section and therefore avoids large instantaneous charging and discharging currents flowing into the opamp's input terminal.

Non-linearity is further improved by including auxiliary input transistors MAUXN and MAUXP and their corresponding resistors R3 and R4, as well as two I current sources 600 and 602 as shown in FIG. 6. The role of these auxiliary input transistors is to provide displacement currents to CPA and CPB without having a need to charge up the parasitic capacitances at the cascode nodes. This effectively reduces the displacement currents and their leakage to the opamp's input terminal. In order not to limit the swing of output transistor's gate terminals, resistors R3 and R4 have been added. These two resistors decouple the main input stage (MIP and MIN) from the auxiliary one (MAUXP and MAUXN). Nodes A and B can therefore swing below or above VMID, respectively. The values of R3 and R4 should preferably be adjusted such that the opamp maintains a good load-driving capability without impacting the high-speed performance of the circuit. The combination of these two techniques substantially improves the harmonic distortion. An exemplary implementation of the driver circuit using the opamp of FIG. 6 may improve harmonic distortion by about 17 dB for a 5 Vpp, 10 MHz differential sine-wave, while driving a 50Ω load from a 3.3V power supply.

Figure 7:
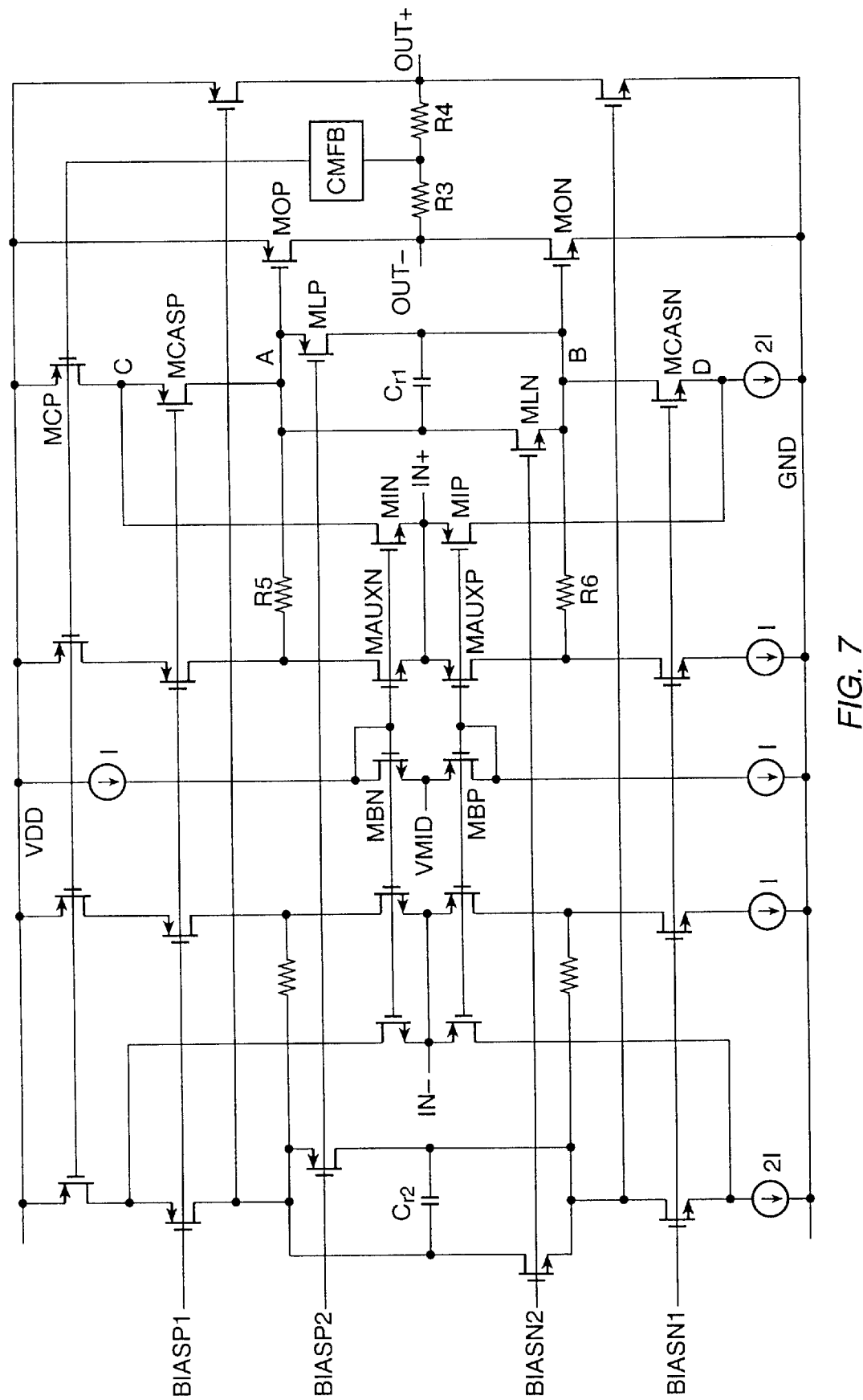
FIG. 7 is a complete circuit schematic for a preferred embodiment of the differential current-feedback operational amplifier of the present invention.

Referring to FIG. 7, there is shown a complete circuit schematic of a preferred embodiment for the fully differential current-feedback operation amplifier of the present invention. The circuit of FIG. 7 corresponds to essentially a combination of two half-circuits as shown in FIG. 6, one for the positive half (IN+ and OUT+) and one for the negative half (IN− and OUT−) along with the common mode feedback circuit CMFB.

In conclusion, the present invention provides a high-speed low-voltage line-driver circuit implemented using various embodiments of high speed current-feedback opamps. In a specific embodiment, the current-feedback opamp used in the line driver of the present invention is a CMOS opamp with class A/B structure for both input and output stages. While the above provides a complete description of several specific embodiments of the present invention, it is possible to use various alternatives, modifications and equivalents. For example, the bipolar transistors connected in a similar architecture as shown in FIG. 3, can be used to implement the current-feedback opamp of the present invention. Therefore, the scope of the present invention should be determined not with reference to the above description but should, instead, be determined with reference to the appended claims, along with their full scope of equivalents.

What is claimed is:

1. A current-feedback operational amplifier comprising:
   an input circuit adapted to receive an input current signal at a current-carrying node;
   a level shift circuit coupled to said input circuit in such a way as to not introduce additional parasitic nodes;
   a current source circuit coupled to said input circuit and said level shift circuit; and
   an output circuit coupled to said level shift circuit,
   wherein, a current supplied by said current source circuit is shared by both said input circuit and said level shift circuit.

2. The current-feedback operational amplifier of claim 1 wherein said output circuit comprises a pull-up and a pull-down transistor coupled in a class A/B structure.

3. The current-feedback operational amplifier of claim 2 wherein the amplifier is fully differential with a positive half comprising first input, first level shift and first output circuits, and a negative half comprising second input, second level shift and second output circuits.

4. The current-feedback operational amplifier of claim 3 further comprising a common-mode feedback circuit coupled between said output circuit and said current source circuit.

5. The current-feedback operational amplifier of claim 2 wherein said input circuit comprises:
   a first field effect transistor having a first current-carrying terminal coupled to receive said current input signal, a second current-carrying terminal coupled to a first node, and a gate terminal; and
   a second field effect transistor having a first current-carrying terminal coupled to receive said current input signal, a second current-carrying terminal coupled to a second node, and a gate terminal.

6. The current-feedback operational amplifier of claim 5 further comprising an input bias circuit coupling bias voltages to said gate terminals of said first and second field effect transistors.

7. The current-feedback operational amplifier of claim 6 wherein said level shift circuit comprises:
   a first field effect transistor having a first current-carrying terminal coupled to said first node and a second current-carrying terminal coupled to said second node; and
   a second field effect transistor having a first current-carrying terminal coupled to said first node and a second current-carrying terminal coupled to said second node.

8. The current-feedback operational amplifier of claim 7 wherein said current source circuit couples to said first node and said second node.

9. The current-feedback operational amplifier of claim 8 further comprising:
   a first cascode transistor coupled between said first node and said first current-carrying terminal of said first field effect transistor in said input circuit; and
   a second cascode transistor coupled between said second node and said first current-carrying terminal of said second field effect transistor in said input circuit.

10. The current-feedback operational amplifier of claim 9 further comprising a capacitor coupled between said first node and said second node.

11. The current-feedback operational amplifier of claim 9 wherein said second field effect transistor in said input circuit, said first field effect transistor in said level shift circuit, said first cascode transistor and said pull-down transistor are of n-channel type, and
   wherein, said first field effect transistor in said input circuit, said second field effect transistor in said level shift circuit, said second cascode transistor and said pull-up transistor are of p-channel type.

12. The current-feedback operational amplifier of claim 7 wherein said first and second field effect transistors in said level shift circuit receive bias voltages at their respective gate terminals.

13. A differential operational amplifier comprising:
   a positive-half circuit including:
      a first input circuit adapted to receive a first input current signal;
      a first level shift circuit coupled to said first input circuit;

a first current source circuit coupled to said first input circuit and said first level shift circuit; and a first output circuit coupled to said first level shift circuit;

a negative-half circuit including:

a second input circuit adapted to receive a second input current signal;

a second level shift circuit coupled to said second input circuit;

a second current source circuit coupled to said second input circuit and said second level shift circuit; and a second output circuit coupled to said second level shift circuit; and a common-mode feedback circuit coupling an output of said first output circuit and an output of said second output circuit to said first and second current source circuits.

14. The differential operational amplifier of claim 13 wherein a current supplied by said first current source circuit is shared by both said first input circuit and said first level shift circuit, and wherein a current supplied by said second current source circuit is shared by both said second input circuit and said second level shift circuit.

15. The differential operational amplifier of claim 13 wherein each of said first and second input circuits comprises a pair of common-gate field effect transistors coupled between a first node and a second node.

16. The differential operational amplifier of claim 15 wherein one of said first and second level shift circuit comprises a first field effect transistor of a first type coupled between said first node and said second node of the respective half circuit, and a second field effect transistor of a second type coupled between said first node and said second node of the respective half circuit.

17. The differential operational amplifier of claim 16 further comprising:

a first cascode transistor in each half circuit, coupled between a respective first node and a first common-gate field effect transistor of a respective input circuit; and a second cascode transistor in each half circuit, coupled between a respective second node and a second common-gate field effect transistor of a respective input circuit.

18. The differential operational amplifier of claim 13 wherein each of said first and second output circuits comprises a p-channel pull-up transistor coupled to an n-channel pull-down transistor.

19. A transmission line driver circuit comprising:

a differential operational amplifier as set forth in claim 13;

a first pair of gain-setting resistors coupled to an input of said first input circuit;

a second pair of gain-setting resistors coupled to an input of said second input circuit; and a pair of output series resistors coupled to an output of said first output circuit and an output of said second output circuit, respectively.

* * * * *